Figure 1:
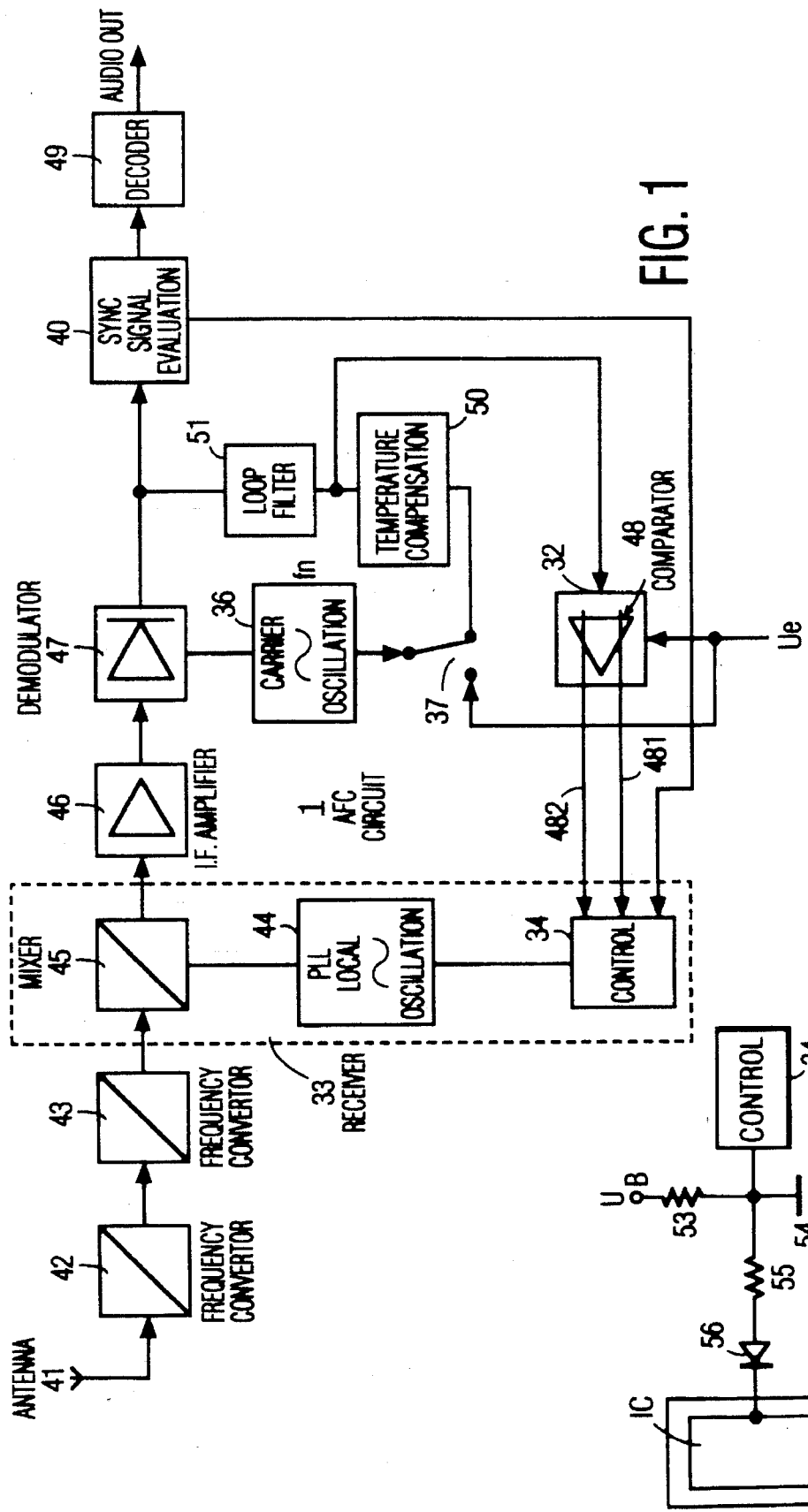

United States Patent [19]
Klank et al.

[11] Patent Number: 5,517,678
[45] Date of Patent: May 14, 1996

[54] SATELLITE RADIO RECEIVER

[75] Inventors: Otto Klank, Lehrte-Arpke; Klaus Eilts-Grimm, Lüneburg; Jürgen Laabs, Pattensen, all of Germany

[73] Assignee: Deutsche Thomson-Brandt GmbH, Villingen-Schwenningen, Germany

[21] Appl. No.: 418,901

[22] Filed: Apr. 6, 1995

Related U.S. Application Data

[63] Continuation of Ser. No. 720,773, filed as PCT/EP89/0125, Oct. 31, 1989, abandoned.

[30] Foreign Application Priority Data

Nov. 2, 1988 [DE] Germany .......................... 38 37 130.8

[51] Int. Cl.⁶ .................................................... H04B 1/16
[52] U.S. Cl. .................................. 455/182.2; 455/164.2; 455/186.1; 455/190.1; 455/192.2
[58] Field of Search ................................. 455/3.2, 164.1, 455/164.2, 182.1, 182.2, 184.1, 186.1, 190.1, 192.1, 192.2

[56] References Cited

U.S. PATENT DOCUMENTS

| | | | |
|---|---|---|---|
| 4,405,947 | 9/1983 | Tults et al. | 358/193 |
| 4,763,195 | 8/1988 | Tults | 358/193 |
| 4,777,657 | 10/1988 | Gillaspie | 455/186 |
| 4,823,387 | 4/1989 | Tults | 455/182 |

FOREIGN PATENT DOCUMENTS

| | | | |
|---|---|---|---|
| 0028100 | 5/1981 | European Pat. Off. . | |
| 2736870 | 2/1978 | Germany | 455/182 |

OTHER PUBLICATIONS

Digital Sound Service for Direct Broadcasting Satellites, Published by the Federal Minister of Research and Technology, Federal Republic of Germany.
Proceedings ICDSC-7, 7th International Conference on Digital Satellite Communications, May 12–16, 1986.

*Primary Examiner*—Chi H. Pham
*Attorney, Agent, or Firm*—J. S. Tripoli; F. A. Wein; P. M. Emanuel

[57] ABSTRACT

A satellite radio receiver obtains signals from a satellite receiving installation comprising one or more frequency converters which may, for example, undergo a frequency drift as a result of temperature variations which cannot be compensated for by an AFC circuit which is located in the satellite radio receiver and which controls a carrier oscillator for carrier regeneration in a demodulator circuit. A local oscillator for a mixer is designed as a PLL local oscillator (44) which can be tuned in large or small increments. The AFC circuit (1) and a synchronizing signal evaluation circuit (40) are coupled to a control circuit (34) so that the PLL local oscillator (44) is tuned: 1) outside the control range of the AFC circuit (1), with a large tuning increment in the case of undetected synchronizing signals, and 2) with a small tuning increment in the case of detected synchronizing signals, until the control range of the AFC circuit (1) is reached. The satellite radio receiver is suitable for connection to satellite receiving installations which comprise a plurality of frequency converters and therefore deviate the nominal receiving frequency in a summary fashion, and for private individual installations which, for economic reasons, possess low frequency stability.

10 Claims, 2 Drawing Sheets

SATELLITE RADIO RECEIVER

This is a continuation of application Ser. No. 720,773 filed as PCT/EP89/01295, Oct. 31, 1989, now abandoned.

The invention is concerned with a satellite radio receiver.

Signals which are received by satellite radio receivers from a satellite receiving facility can be subject to a frequency drift. The cause of the frequency drift is an instable oscillator of the satellite receiving facility or of further intermediate converters. Hereby, due to the high transmission frequency, even relatively small deviations in frequency cause large absolute deviations in the intermediate frequency in the satellite radio receiver. This effect can lead to a situation in which the automatic frequency control of the carrier oscillator for the demodulator circuit can no longer compensate the frequency drift.

It is the object of the invention to improve a satellite radio receiver in such a way that even in frequency deviations in the received signal which go beyond the adjustment area of the automatic frequency control for the carrier oscillator a fast and reliable adjustment (tuning) is obtained.

The invention primarily utilizes a missing sync signal as a criterion for the tuning. In this case the PLL local oscillator is tuned in large frequency steps (search mode). Thereby, a fast approach to the beat frequency which is optimum for the compensation of the frequency deviation is achieved. Through this, an approach to the lock-in area, for example of the 4PSK demodulator, is obtained. If a sync signal is received the frequency steps for the fine tuning of the PLL local oscillator are reduced. The further tuning of the PLL local oscillator is then performed in small frequency steps until the frequency deviation of the demodulator –VCOS lies within the boundaries of a window which lies in the vicinity of the center frequency of the tuning area and is smaller than, for example, the borders of two small step ranges.

Further developments and advantageous implementations of the invention are given in the claims, the further description and the drawing which illustrates an example implementation of the invention.

Figure 2:
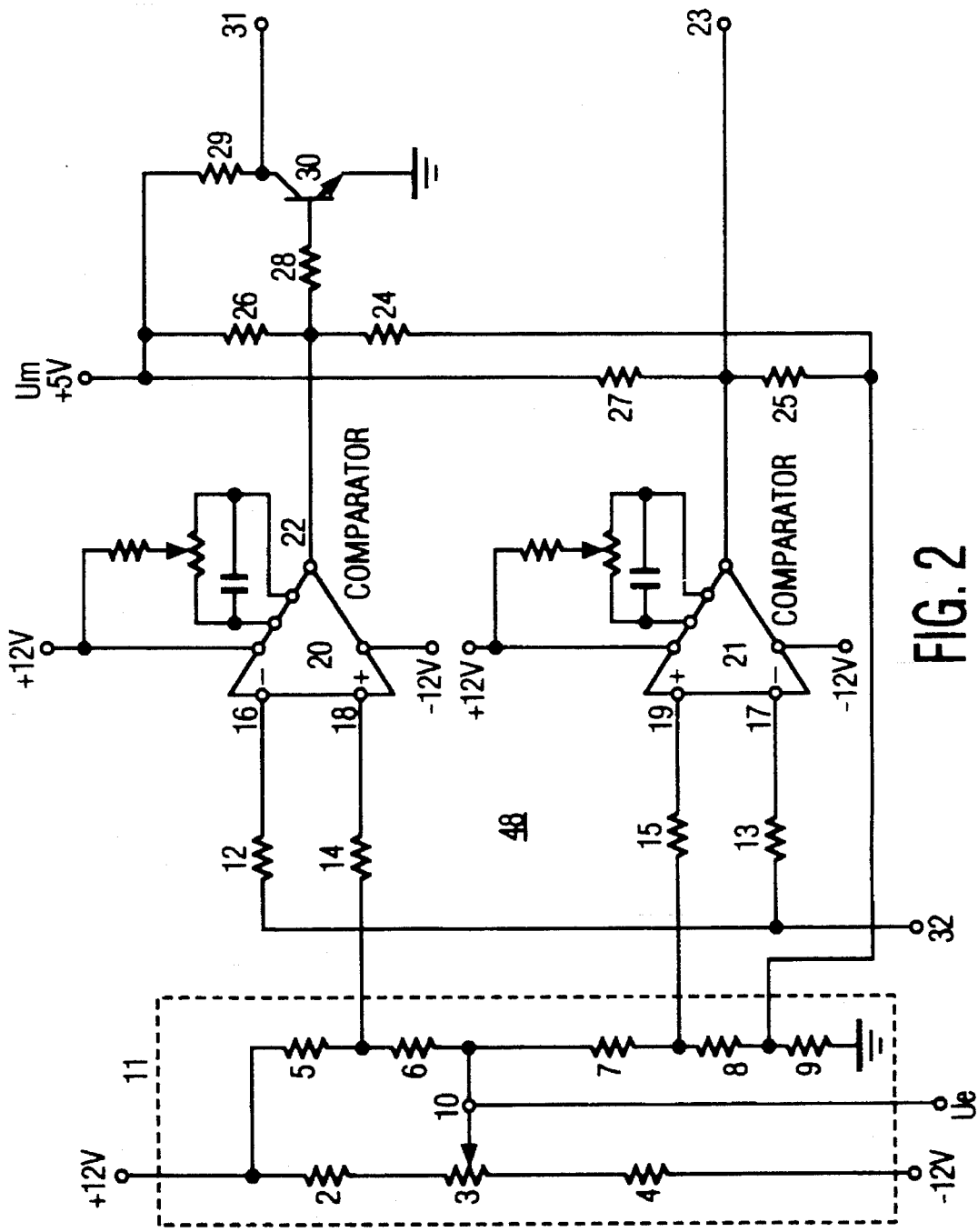

In the drawing show:

FIG. 1 a block circuit diagram of a satellite audio broadcasting receiver with a satellite receiving facility and FIG. 2 a circuit diagram of a comparator circuit as part of an AFC circuit from FIG. 1

FIG. 3 a circuit diagram for the gaining of an error signal from the concealment signal.

FIG. 1 shows a block circuit diagram of a satellite radio receiver which is connected to a satellite receiving facility. The satellite receiving facility consists of a satellite antenna 41 as well as two frequency converters 42 and 43. The satellite radio receiver comprises a receiver part 33 with a mixer 45, a PLL local oscillator 44 and a control circuit 34, a IF amplifyer 46, a demodulator circuit 47, a carrier oscillator 36, an AFC circuit 1, a sync signal evaluation circuit 40 as well as a decoder circuit 49. At the output of the decoder circuit 49 audio signals are present.

If the received frequency is kept precisely constant the PLL local oscillator 44 can be set to a pre-determined, agreed frequency, and the result at the output of the mixer 45 is an intermediate frequency with the nominal value of the IF. The demodulator circuit 47 following behind the IF amplifyer 46 the signal, which is preferably present in the 4PSK modulation format, can be demodulated. For carrier regeneration in demodulation the carrier oscillator 36 is used which is controlled in such a way that it oscillates in a phase synchronous way with respect to the modulated signal. Thereby, the oscillator 36 receives the input signal from the output of the demodulator circuit 47 via the loop filter 51.

If the received frequency deviates from its nominal value it becomes impossible for the demodulator 47 to readjust the carrier oscillator 36. This effect, which in itself is unfavorable for signal recovery, is utilized for re-tuning the local oscillator 44 through the control circuit 34, preferably a microprocessor, in such a way that the intermediate frequency is adjusted to its nominal value. In this case, the control circuit 34 thus receives the instruction to re-tune the PLL local oscillator 44 step by step. The re-tuning is thereby determined by the respective output of the circuits 40, 48. At the same time, the control circuit 34 receives a signal also from the sync signal evaluation circuit 40 the state of which is dependent upon whether a sync signal is recognized or not recognized. If no sync signal is present, i.e. the demodulator 47 has not locked, the tuning of the PLL local oscillator 44 is peformed in large steps of preferably 250 kHz. If, on the other hand, a sync signal is present the PLL local oscillator 44 is tuned by small steps of preferably 62.5 kHz. The time interval between steps is chosen so as to correspond to the transient period of the system. The process of tuning is continued in a search mode until the demodulator has locked. The tuning in the lock-in area is continued in small steps until a window of the width of two small steps around the center frequency of the demodulator is reached.

For triggering of the control circuit 34, particularly the microprocessor, the AFC circuit 1 contains a comparator circuit 48 which compares the AFC signal with an upper and a lower threshold value.

FIG. 2 shows the design of a comparator circuit 48, whereby a first comparator 20 is present for the upper and a second comparator 21 for the lower threshold value. The AFC signal is fed to the one inputs 16, 17 of the comparators 20, 21 via resistors 12 and 13, and reference voltages are fed to the other inputs 18, 19 via resistors 14 and 15 and a voltage divider circuit 5 . . . 9. Outputs 31, 23 of the comparator circuit 48 are connected with the control circuit 34 whereby the output 31 determines one and the other output 23 determines the other tuning direction.

Two end connections of the voltage divider circuit 5 . . . 9 lie at fixed reference voltages +U, ground, and a tap lies at an adjustable reference voltage $U_e$. A further tap is connected to a regeneration voltage $U_m$ which is tapped at the outputs 22, 23 of the comparators 20, 21. The adjustable reference voltage $U_e$ is set to a value which tunes the carrier oscillator 36 to a rated frequency $f_n$.

The voltage divider circuit comprises a serial connection made of resistors 5, 6, 7, 8 and 9 whereby the resistor 5 with its free end is connected to the positive potential +U whereas the resistor 9 with its free end is connected to zero potential (ground). The input 18 of the first comparator 20 is connected, via the resistor 14, to the tap between the resistors 5 and 6 and the input 19 of the second comparator 21 is connected, via the resistor 15, to the tap between the resistors 7 and 8. The tap between resistors 6 and 7 is connected to the adjustable reference voltage $U_e$ whereas the tap between the resistors 8 and 9 is connected to the regeneration voltage $U_m$.

The adjustable reference voltage $U_e$ is generated in a circuit which comprises a serial connection of a resistor 2, an adjustable resistor 3 with a tap 10 and a resistor 4 whereby the resistor 2 at its free end is connected to a positive potential +U whereas the resistor 4 at its free end is connected to a negative potential –U. The tap 10 is connected with the tap between the resistors 6 and 7. A further connection of the tap 10 exists with switch 37 used for an adjustment through which the tap 10 can be connected to the control input of the carrier oscillator 36.

The output 22 of the first comparator 20, via a pre-resistor 28, is connected to the control input of an inverter 30 designed as a NPN transistor the output of which is the first output 31 of the comparator circuit 48. The output of the second comparator 21 is the second output 23 of the comparator circuit 48.

For positive feedback of the output signal to the inputs 18 and 19 the outputs 22 and 23 are connected, via resistors 24 and 25, with the taps between the resistors 8 and 9. In addition, the outputs 22 and 23 are connected, via resistors 26 and 27, to the positive potential +5 V which is also the case for a resistor 29 which is connected to the output 31 of the transistor 30. Thereby, a TTL adjustment is created with respect to the signal level.

The above described circuit arrangement works in the following way:

In order to set the correct reference voltage for the comparators 20 and 21, by closing the switch 37 the control input of the carrier oscillator 36, which is temporarily running free during the adjustment, is connected with the tap 10 of the adjustable resistor 3. By adjusting the adjustable resistor 3 the voltage fed to the control input of the carrier oscillator 36 is now set in such a way that the latter can be tuned to the carrier frequency, e.g., 70 MHz.

In the so described circuit a temperature change, for example, effects a shift of the window in relation to the center frequency of the demodulator 47. For compensation of the influence of the temperature a temperature compensation circuit 50 is used. Because the influence of the temperature compensation circuit 50 is added to the adjustment voltage for the control input of the VCO 36, the adjustment voltage already has to be tapped at the output of a loop filter 51 or to be fed to the signal input 32 of the circuit arrangement 1, and the reference potential ($U_e$) for feedback adjustment must be based upon the output of the loop filter 51.

For obtaining the reference potential $U_e$ the positive potential +6.7 V, which is set in the default setting of the VCO 36 at the tap 10 in FIG. 2, is first reduced by the voltage drop at the temperature compensation circuit 50 with the adjustable resistor 3 and, subsequently, adjusted by means of, for example, a tunable test signal fed in via 41 in such a way that the switching point of the comparator 20 is identical with the lower and the switching point of the comparator 21 is identical with the upper admissible frequency deviation from the carrier signal frequency 70 MHz. Hereby, it follows that the reference potential obtained in this way at the tap 10 adopts a frequency symmetrical position with respect to the switching points. Both switching points thus define a window for tuning and tuning direction.

The switching point of the first comparator 20 lies above the reference voltage $U_e$ by the voltage drop at the resistor 6 plus a hysteresis voltage, and the switching point of the second comparator 21 lies below the reference voltage $U_e$ by the voltage drop at the resistor 7 plus a minor hysteresis voltage. Thereby, a window for the borders of the frequency deviations is determined. Outside the window a step-by-step tuning of the PLL local oscillator 44 is performed in small steps and the tuning directions are differentiatedly predetermined. Inside the window the system is at rest, the feedback loop is interrupted.

For automatic frequency control the adjustment voltage of the carrier oscillator 36 is fed to the signal input 32 of the comparator circuit 48 and compared to the potential of the switching point of the first comparator 20 and the second comparator 21. If the adjustment voltage is within the window the output 23 is connected with the positive border of adjustment whereas the output 22 of the first comparator 20 is in connection with the negative border of adjustment. Through this, the transistor 30 is locked and the output 31 also lies at the positive adjustment border. Thus, at both outputs 23 and 31 signals logical H are present. The PLL local oscillator 44 is correctly tuned.

If the adjustment voltage of the carrier oscillator 36, due to a mis-tuning, exceeds the potential of the switching point of the first comparator 20 by the hysteresis voltage, the output 31 becomes connected to the negative border of adjustment whereas the output 23 remains in its position at the positive border of adjustment. Thus, at the outputs 31 and 23 the signals logical L and logical H are present. The frequency of the PLL local oscillator 44 is re-tuned.

If the adjustment voltage of the carrier oscillator 36, due to a mis-tuning in the reverse direction, falls below the potential of the switching point of the second comparator 21 by the hysteresis voltage, the output 23 becomes connected with the negative border of adjustment whereas in this case the output 31 remains in its position at the positive border of adjustment. At the outputs 31 and 23, in this case, the signals logical H and logical 5 are present. The frequency control of the PLL local oscillator 44 in this case operates in the reverse direction.

If no sync signal is present the inputs of the sync signal evaluation circuit 40 connected to the outputs 23 and 31 are switched to "inactive" so that the feedback loop is interrupted. The control circuit 34 initiates a channel search mode. If a signal is recognized or a sync signal is generated the feedback loop takes charge of the further adjusting whereby the control circuit 34 evaluates the signals received from the comparator circuit 48 in order to establish the direction of tuning.

It is an advantage of the described circuit that the width of the window is independent of the setting of the adjustable resistor 3. Through dimensioning of the resistors in the voltage divider circuit and the arrangement of the resistors 6 and 7 for the obtaining of the comparator switching points it has been achieved that a change in the setting, due to a possibly necessary replacement of a part, effects equal shifts of potential at the inputs 18 and 19 of the comparators 20 and 21.

The 4PSK demodulator circuit 47 comprises a phase control loop 47, 51, 50, 36 (PLL) in which upon signal reception for recovery of the carrier signal not present in the signal spectrum an adjustment voltage gained from the output signals of the 4PSK demodulator circuit 47, via a loop filter 51 and a subsequent VCO temperature compensation circuit 50, is fed to the control input of a voltage controlled oscillator (VCO) 36. Advantageous for such a circuit is a so-called Costas Loop.

There is also a connection between the control input of the VCO 36 and a switch 37 through which the control input can be connected with the tap 10 of the adjustable resistor 3 which, at the same time, interrupts the phase feedback loop. This connection is meant for default setting of the free running VCO 36 to a frequency of 70 MHz at a positive potential of +6.7 V at the tap 10 before conducting the adjustment of the 4PSK demodulator circuit.

The output voltage of the loop filter 51 is a direct indicator of the frequency or the frequency deviation of the carrier signal in the intermediate frequency range.

Under certain circumstances the evaluation circuit 40 can, even when no sync signal is present, simulate the existence of such a sync signal and adversely affect the tuning.

FIG. 3 shows a circuit for gaining an error signal, i.e. an error signal for controlling the control circuit 34, by which this effect can be overcome. For this purpose, a circuit for integration of concealment signals is connected to the sync signal evaluation circuit 40. Such concealment signals are usually generated and evaluated in evaluation circuits for the processing of digital signals, for example in an IC SAA 7500. In FIG. 3 these concealment signals are integrated. This is achieved by an RC part 53, 54 by which the capacitor 54 is charged by the operating voltage UB via the resistor 53 to a voltage of Logical High. This voltage is present at the input of the control circuit 34 in FIG. 1. The full voltage Logical High indicates that the search mode is being initiated. This charged state of the capacitor 54 remains for as long as a large number of error signals appear at the input of the evaluation circuit 40. As soon as the number of error signals drops the capacitor 54 is discharged via the resistor 55, the diode 56 and the circuit 40; the voltage at the input of the control circuit 34 drops to Logical Low and effects a switching-over to tuning in small steps until the window area around the center frequency of the demodulator 47 is reached. For the charging of the capacitor 54 with the resistor 53 a larger time constant is of advantage. For the discharging via 57, 40, i.e. for the switching-over to fine tuning, however, a small time constant is required.

For the control circuit 34 a microprocessor, for example of the type μPD7811, is of advantage. This can not only take over the tasks of the control circuit 34 but, besides the evaluation of the information of the comparator 48 and the sync signal evaluation circuit 40 for the search and the fine tuning process, also the timing of the switching-over of the control circuit 34 according to FIG. 3 for the sampling of the control lines 481 and 482 and for the step-by-step change of the frequency of the oscillator 44. In the search or, respectively, fine tuning mode the processor, for a guaranteed flawless transient process of the system, introduces wait periods of different duration which can replace or support the integration according to FIG. 3. Under unfavorable receiving conditions short term failures of the synchronization may occur. At this time, the processor must not immediately switch to search mode because, in this case, long mute times would be disturbing. The processor waits in a pre-determined time span for a new "synchronizing-up" of the system without changing the tuning of the oscillator.

The circuit represented in FIG. 1 can be altered in such a way that the frequency of the oscillator 36 is evaluated in a high precision discriminator and the control voltage is fed to the comparator circuit 48. Thereby, the influences of temperature are reduced.

We claim:

1. A satellite radio receiver of a satellite receiving facility which includes signal feeds from a receiving antenna and at least one frequency converter, the satellite radio receiver comprising:

a PLL local oscillator which is tunable in one of a large step range and in a small step range in response to a control signal, a PSK demodulator circuit with a carrier oscillator and having an output signal, a sync signal evaluation circuit responsive to the output signal of the demodulator circuit for providing a recovery output signal, the output signal of the sync signal evaluation circuit and a version of the output signal of the PSK demodulator circuit after being operated upon by a loop filter and a comparator being coupled to inputs of a control circuit which provides the control signal for tuning the PLL local oscillator in the large step range outside a lock-in range of the demodulator circuit when one of the version of the output signal of the demodulator circuit and the output signal of the sync signal evaluation circuit are not recognized by the control circuit so that no signal is received by the PLL oscillator from the control circuit, and sharply tuned in a small step range within the lock-in range when one of the version of the output signal of the demodulator circuit and the output signal of the sync signal evaluation circuit are recognized and signals are received by the PLL oscillator from the control circuit, a comparator circuit which compares the version of the output signal of the demodulator circuit with an upper and a lower threshold value, a pair of output terminals of the comparator circuit being connected with the control circuit whereby signal at one output terminal determines a first direction of tuning and signal at another output terminal determines the other direction of tuning, the version of the output signal of the demodulator circuit being the signals at the output terminals of the comparator circuit, and the sync signal evaluation circuit includes a circuit for evaluation of an error rate of received signals from the demodulator circuit and provides an error signal, an integration means for integrating the error signals in a pre-determined manner with pre-determined time constants, and transition means responsive to an output signal of the integration means and having a threshold referenced to a reference voltage for determining the recovery output signal coupled to the control circuit for determining the switching-over of the large and small step ranges.

2. Satellite radio receiver according to claim 1, wherein the large step range is smaller than the lock-in range of the demodulator circuit.

3. Satellite radio receiver according to claim 2, wherein the large step range is approximately 250 kHz and the small step range is approximately 62.5 kHz.

4. Satellite radio receiver according to claim 1, wherein the comparator circuit comprises a first comparator for an upper threshold value, a second comparator providing a lower threshold value, and that an AFC signal is fed to first inputs of the first and second comparators, and reference voltages are fed to second inputs of the respective first and second comparators via a voltage divider circuit.

5. Satellite radio receiver according to claim 6, wherein two end connections of the voltage divider circuit are connected to respective fixed reference voltages and a first tap is connected to an adjustable reference voltage of the voltage divider circuit.

6. Satellite radio receiver according to claim 5 wherein a second tap is connected to a regeneration voltage which is obtained at outputs of the first and second comparators.

7. Satellite radio receiver according to claim 5 wherein the adjustable reference voltage is set to a value which adjusts the carrier oscillator to a rated frequency.

8. Satellite radio receiver according to claim 5 wherein the voltage divider circuit comprises a serial connection including the first tap made of first and second resistors and a junction therebetween, that the first resistor includes a third tap and its free end is connected to a positive potential whereas the second resistor has a second and fourth tap and its free end is connected to zero potential, that an input of the first comparator is connected to the third tap and an input of the second comparator is connected to the fourth tap, and that the second tap is connected to a regeneration voltage which is obtained at the outputs of the first and second comparators.

9. Satellite radio receiver according to claim 5 wherein the adjustable reference voltage is generated in a circuit arrangement which comprises a serial connection of a third resistor, a changeable resistor with a fifth tap, and a fourth resistor, whereby the third resistor has its free end connected to a positive potential, the fourth resistor has its free end connected to a negative potential, and that the fifth tap is connected with the first tap.

10. Satellite radio receiver according to claim 1 wherein the tuning of small step range is performed in both directions.

* * * * *